US006737219B2

(12) United States Patent  (10) Patent No.: US 6,737,219 B2
Holt et al.  (45) Date of Patent: May 18, 2004

(54) PHOTOPOLYMER SACHET

(75) Inventors: Paul Mayo Holt, 29 Afghan Road, London SW11 2QD (GB); Maria Peneva Dincheva, Corby (GB)

(73) Assignee: Paul Mayo Holt, Uppingham (GB)

( * ) Notice: Subject to any disclaimer, the term of this patent is extended or adjusted under 35 U.S.C. 154(b) by 0 days.

(21) Appl. No.: 09/985,034

(22) Filed: Nov. 1, 2001

(65) Prior Publication Data

US 2003/0039915 A1 Feb. 27, 2003

(30) Foreign Application Priority Data

Aug. 10, 2001 (GB) .............................. 0119546

(51) Int. Cl.$^7$ .............................. G03F 7/038
(52) U.S. Cl. ................ 430/281.1; 430/138; 430/284.1; 430/286.1; 430/287.1; 430/288.1; 430/302; 430/306; 430/309; 430/322; 430/325; 430/394; 430/434; 101/114; 252/299.01; 428/34.1
(58) Field of Search .................. 430/284.1, 138, 430/270.1, 281.1, 286.1, 287.1, 288.1, 302, 306, 307, 309, 322, 325, 326, 331, 394, 401, 413, 434, 494; 101/114, 130, 453, 463.1, 465; 252/299.01; 428/34.1

(56) References Cited

U.S. PATENT DOCUMENTS

| 4,216,287 A | | 8/1980 | Sano et al. ................. 430/271 |
| 4,415,654 A | * | 11/1983 | Pohl ........................... 430/328 |
| 5,099,997 A | * | 3/1992 | Ooms et al. ................. 206/484 |
| 5,277,721 A | * | 1/1994 | Ooms ........................... 159/64 |
| 5,611,279 A | * | 3/1997 | Ando et al. ............... 101/401.1 |
| 5,771,808 A | * | 6/1998 | Kuriyama et al. ........ 101/401.1 |
| 5,915,299 A | * | 6/1999 | Kuriyama et al. ...... 101/128.21 |
| 6,095,046 A | * | 8/2000 | Lookholder et al. ......... 101/405 |
| 6,432,190 B1 | * | 8/2002 | Scholz et al. .......... 106/287.11 |

FOREIGN PATENT DOCUMENTS

| EP | 0607106 | | 7/1994 | |
| JP | 54-114305 | | 9/1979 | |
| JP | 60-240737 A | * | 11/1985 | .............. C08J/3/28 |
| JP | 6141148 | | 2/1986 | |
| WO | WO9533613 | | 12/1995 | |
| WO | WO0144874 | | 6/2001 | |

OTHER PUBLICATIONS

Webster's II New Riverside University Dictionary. United States of America: Houghton Mifflin Company, 1988.*

* cited by examiner

Primary Examiner—Mark F Huff
Assistant Examiner—Barbara Gilliam
(74) Attorney, Agent, or Firm—Kolisch Hartwell, P.C.

(57) ABSTRACT

The invention provides a photopolymer package for use in making a hand stamp plate, the package consisting of a sachet containing a photocurable liquid polymer, the walls of the sachet being formed of material capable of being released from the cured photopolymer. Methods for the formation of the package and the hand stamp plate are also provided. The invention eliminates the requirement for the use of a backing layer in the package and thereby offers significant advantages over the prior art in terms of cost and efficiency.

55 Claims, No Drawings

PHOTOPOLYMER SACHET

The present invention relates to a method for forming a sachet containing a curable liquid polymer from which a printing plate is to be formed and to a photopolymer package comprising a sachet.

The normal technique for making photopolymer printing plates for hand stamps or flexography is as follows: a masking element (in practice a photographic negative) is placed on a horizontal glass support of a plate-making machine (i.e. a device for irradiating the photopolymer with curing radiation). A transparent plastics cover sheet is placed over the masking element and, in turn, a containment wall is put on the cover sheet to form a reservoir or tray for liquid photopolymer.

Liquid photopolymer is then poured into the tray defined by the containment wall to substantially fill the reservoir to its top. Indeed, it is preferably filled sufficiently for a convex meniscus to rise above the containment wall as any overfilled polymer will be forced over the containment wall, whereas an underfilled reservoir would produce a thin plate of poor image. A semi-rigid backing sheet is then carefully placed over the liquid. An upper radiation source (the "lid" of the plate making machine) is closed down the backing plate and the remaining air is evacuated from under the cover sheet which forms the bottom of the liquid reservoir. The prepolymer is then irradiated from above, to form a continuous cured polymer layer supporting the printing surface and from below, for imagewise curing of the prepolymer to form the printing surface. The backing sheet has a surface-treatment so that cured polymer layer adheres firmly to it.

The cured plate is removed and uncured resin is washed out from the unexposed areas, whereupon the plate is ready for use.

The use of a backing plate which is semi-rigid is regarded as indispensable for two purposes:
 a) to exclude air from the reservoir, since it would be difficult or impossible to do this reliably with a fully flexible thin sheet; and
 b) to provide the plate, when cured, with the necessary strength and stability to stop premature disintegration during its use as a hand stamp plate or a flexographic printing plate.

The technique of pouring liquid into a reservoir is universally used, notwithstanding that it is difficult to fill the reservoir correctly and that the use of such liquid is difficult, messy and can represent a health and environmental hazard. It is not surprising that attempts have been made to provide the liquid resin in a sealed package, therefore, but none of these attempts has met with success.

JP 61041148, published on Feb. 27, 1986, addresses the problem of the intrusion of air bubbles into the resin and the difficulty of pouring the correct amount of resin into the reservoir. JP 61041148 proposes to solve these problems by sealing a prescribed amount of a photosensitive resin inside a flat container which has transparent walls. The specification alleges that this eliminates concern regarding the presence of air bubbles.

The container of JP 61041148 contains two walls: the first of these comprises a transparent flexible synthetic resin film with an outer face which is contacted with an imaging medium, such as a photographic negative, and which is designed to be detachable from the imaging medium, and whose inner face is arranged to be detachable from the sealed photosensitive resin following curing by exposure; the second of the container walls, on the other hand, is formed from a transparent flexible synthetic resin film which is designed to be adhesive to the cured photosensitive resin. The films forming the two walls are formed to the desired size, then superposed to form the container, a suitable inlet being retained. The required amount of the photosensitive resin is then poured into the container by means of the inlet, a reduced pressure filling device being used to ensure the absence both of air bubbles and of any air gap between the container wall and the resin. The inlet edge of the container is then tightly sealed by melt deposition to form the desired resin holder, which may then be irradiated through a photographic negative to cure the resin in the image areas.

It is noted that the method of JP 61041148 incorporates the use of a container wall comprising a synthetic resin film which is specifically designed to adhere to the cured photosensitive resin so that, following removal of the uncured resin in the non-irradiated areas, the plate comprises the imaged, cured resin attached to the adherent film which, thereby, serves as a backing sheet for the printing plate. This is very much in accordance with the accepted practice in the platemaking art, wherein it is universal for a stiff backing sheet to be used, the backing sheet being caused to adhere to the photopolymer when it is cured to provide a support for the plate formed on curing the photopolymer.

In the Japanese patent, the film which forms the backing sheet comprises a chlorinated, or chlorosulphonated, polyalkylene resin. The use of such materials would, however, be impractical due to their high cost and difficulty in manufacture. Furthermore, in the technique of JP 61041148 it would be expected that further problems would arise as a consequence of the differences in flexibility, tensile strength, and thermal and other physical properties between these resins and the resins forming the opposing walls of the containers.

However, apart from the particular difficulties associated with a backing sheet in the form disclosed in JP 61041148, there are clearly potential disadvantages generally associated with the use of such components in platemaking. It is necessary, for instance, that they should be selected such that adhesion occurs between backing sheet and resin after curing, and that the adhesion should be strong enough to withstand the harsh conditions associated with printing operations without risk of detachment. Furthermore, the requirement for the backing sheet to display a certain level of strength and rigidity has clear implications in terms of cost.

The technique described in JP 61041148 has apparently never been commercialised. In this respect, the skilled person would have considered it to suffer from two technical problems. Firstly, the specification asserts that the method "eliminates" air bubbles. It is known in the liquid packaging industry that it is difficult to eliminate air bubbles unless the packaging is overfilled or steps are taken to avoid contamination with air bubbles, for example via the use of a vacuum system; the claimed technique appears to offer no advantages over the known art in this respect. Secondly, the method involves the thermosealing of dissimilar plastics sheets, one of which is a relatively expensive chlorinated film.

The thermosealing of dissimilar sheets is always avoided wherever possible because the different coefficients of thermal expansion will give rise to a somewhat distorted product. Moreover, the different physical properties of the two films are liable to result in differential stretching and flexing of the opposed faces, again leading to distortions in the finished package and hence likely distortions in the cured plate.

Another attempt to form a sealed photopolymer sachet is disclosed in EP-A-607106 (De Caria), which concerns a process wherein a photosensitive composition is introduced into a flat pocket or bag made from transparent thermoplastic material, and its drawings show that it relies essentially on the established technology of pouring liquid into a tray. When filled, air is evacuated from the assembly, and the whole is then thermosealed to provide a bag which is laid on a plane surface and pressed by means of a parallel upper plane surface. The specification proposes use of a relatively stiff backing sheet, without which the skilled person would not have contemplated performing the invention. When the bag is placed between plane surfaces which comprise transparent plates, a photographic negative may be interposed to allow imagewise irradiation of the bag such that curing of the photosensitive composition occurs. Removal of the protective bag, by cutting or tearing, then provides a printing plate precursor, which may be washed to remove the uncured composition in the non-irradiated areas, thereby providing the final printing plate.

In the production of printing plates by means of this process, it is essential that all air should be removed from the filled pocket or bag prior to irradiation in order that imperfections do not occur in the final printing plate. EP-A-607 106 teaches subjecting the thermosealed bag to the action of rollers, whereby entrapped air may be pushed towards a particular section of the bag, this then being pierced by, for example, the action of a needle, such that release of all the entrapped air is achieved. The small hole so formed may then be resealed with an adhesive, or by other suitable means. The European patent application also teaches the evacuation of air from the bag.

Whilst printing plates may be achieved by means of such procedures—and examples have, indeed, been made publicly available at an exhibition—it is significant that the production of printing plates in this way has never been successfully commercialised: despite its manifest problems, the technique of pouring liquid prepolymer into a tray on the plate making machine is universally used. It is likely that this is consequent upon the fact that the production techniques are necessarily cumbersome and inefficient, and therefore do not prove to be cost effective.

Consequently, the present invention seeks to provide means for forming a sachet containing a curable liquid polymer which avoids the need for the complications associated with the devices of the prior art and is, therefore, advantageous commercially. Thus, the present inventor has shown that the method of filling and sealing of a sachet may be simplified considerably by the adoption of new and inventive techniques.

It has now been found by the present inventor that high performance hand stamp printing plates may be obtained by means of a process wherein a sachet is filled with a curable liquid resin in the absence of a backing sheet, the sachet is then irradiated to cure the resin, the outer walls of the sachet are removed, and the contents are washed to remove uncured resin in non-irradiated areas. In this way, it has been possible to provide a device for forming a printing plate, and a method for forming the device, which fly in the face of the hitherto accepted technology in dispensing with the use of a backing sheet and thereby offer significant advantages over known processes in terms of simplicity, efficiency of production, and cost.

The preferred mode of forming the photopolymer package according to the invention envisages the introduction of photopolymer into the sachet, this then being allowed to settle, causing the sides of the sachet to distend slightly after filling, such that the sachet is not completely full; a vacuum is then applied to draw the sides of the sachet together above the photopolymer surface, and the sides are then sealed together at this point. This technique, therefore, does not rely on overfilling the sachet. The empty sachet may optionally be formed as an envelope, from a sheet or sheets of material, as the first stage of the manufacture of the photopolymer package. Preferably, however, it is supplied as a pre-formed pouch, which is then filled with the photopolymer prior to sealing. In either case, the empty sachet comprises a rectangular package, sealed on three sides, with the fourth side open to allow for filling of the sachet.

However, the present inventor has also shown that, in the preparation of hand stamp printing plates, the presence of a small amount of residual air in such sachets prior to curing is not significantly detrimental to the properties of the printing plates even if the backing plate is dispensed with. This is believed to be due to the fact that, when the sachet is placed on the plate making machine, and despite the viscous nature of the photopolymer liquid, the air bubbles can rise to the surface of the liquid so that, when the sachet is imagewise irradiated from the underside, the resin surrounding any bubbles will already have been cured to form the floor. In other words, the bubbles are cured into the back side of the plate and not its printing surface. Small imperfections in this region are of no great consequence. Furthermore, the plates remain adequately stable even in the absence of a backing sheet, which the industry has previously regarded as indispensable. Thus, it is possible to envisage a process wherein a sachet is filled and subsequently sealed without any requirement for additional procedures for the removal of air bubbles The development of this technique has resulted from an appreciation by the inventor that the assumptions of the prior art were not necessarily accurate. Hitherto, it has been assumed that the tendency for air to be trapped within a sachet would inevitably result in serious difficulties since, if the photopolymer was to cure with the air still trapped inside the sachet, the resulting plate would be pockmarked with air pockets, and thus have a damaged printing surface as well as imperfections which could lead to inherent weaknesses in the plate, with a consequent deleterious effect on plate performance notwithstanding the reinforcing backing sheet.

However, the present invention also envisages a process wherein careful selection of the plastics material from which a sachet is formed allows for the introduction of liquid photopolymer into the sachet in an amount in excess of that required to fill the sachet, the sachet then being sealed despite the presence of the excess photopolymer in the region in which the seal is to be formed. This is possible because the plastics material is capable of thermosealing in these circumstances, and the technique thereby circumvents laborious procedures associated with the removal of trapped air from the sachet, since the sachet may be sealed in the knowledge that the overfilling procedure will have ensured that no air remains trapped therein.

Thus, it can be seen that the present invention allows for the use of a variety of filling methods for the sachet and, in the absence of a backing sheet which had, according to the prior art, previously been indispensable, these techniques are not associated with the technical complexities and difficulties encountered with known methods.

Thus, the invention provides a photopolymer package for use in making a hand stamp plate, the package consisting of a sealed sachet and a curable liquid photopolymer preparation contained in the sachet, the walls of the sachet being formed of material which is releasable from the cured photopolymer. After the photopolymer has been cured, therefore, the sachet is stripped from the cured resin to provide a backing sheetless resin plate. In other words, a package which consists essentially of resin and sachet material which is releasable from (can be stripped by hand from) the cured resin is devoid of any structure to form a future backing sheet.

Preferably, the sachet is produced from a pouch which is pre-formed from two sheets of material; one is placed on top of the other and the assembly is sealed on three sides, preferably by thermosealing, leaving a pouch, sealed on two sides and at the bottom, with one open side at the top, forming a mouth through which filling with photopolymer can take place. (The terms "top", "bottom" and "side" refer here to the future orientation of the sachet during filling). The walls of the sachet are formed of the same material. The pouch may also be pre-formed from a single sheet of material, the sheet being folded in half and the two sides adjacent the fold being sealed, preferably by thermosealing, leaving the side of the pouch opposite the folded side open for filling with photopolymer.

Alternatively, the sachet may comprise a four-sided form-fill-seal sachet, wherein an envelope, sealed on three sides, is formed from a sheet or sheets of material immediately prior to filling with photopolymer, the fourth side being sealed to provide the finished sachet following completion of the filling operation.

The walls of the sachet are made of plastics material. Whilst a wide range of such materials is suitable for use in the context of the present invention, it is necessary that the material selected should possess two properties inherent in photopolymer systems: in the first instance, it is clearly a requirement that the material should allow for a high degree of transmittance of curing radiation, e.g. UV-radiation, since the photopolymer in the package is normally UV-cured; secondly, the radiation which is transmitted should pass through the material without being seriously diffracted. Further, it is desirable that the material should have a high degree of resistance to creasing, otherwise the sachet will have to be handled with great care.

Conveniently the plastics material is a polyolefin material or a polyolefin laminate. The polyolefin is typically polyethylene or a polyethylene copolymer or polyethylene blend. Nylon and other normal polyamide materials are found to diffract light, but orientated polyamides (OPA) do transmit light and may be used. Preferably, the plastics film is a laminated plastics material. Optionally, the plastics film may be surface treated, but it is preferred that untreated plastics material should be employed. Particularly favourable results have been achieved using a polyethylene/polyethylene terephthalate laminate material. In such commercially available materials, the layers of the two plastics are bonded together by means of an adhesive interlayer.

A further parameter which must be considered in relation to the three properties specified above is the thickness of the plastics material. Thus, it is found that increasing thickness leads to improvements in terms of crease resistance, but is also associated with reductions in light transmittance. Conversely, thinner films give a high level of light transmittance, but show an increased tendency towards creasing.

Consequently, a preferred range of thickness for any given plastics material should be established, in order that all aspects of performance may be optimised. Desirably, the plastics material has a thickness of from 30 to 100 $\mu$m, and more preferably of 30 to less than 95 $\mu$m. Hence, for the polyethyelene/polyethylene terephthalate laminate material previously mentioned it has been found that thicknesses above about 100 $\mu$m are associated with unacceptably low light transmittance levels and a very bad image, whilst creasing becomes a major problem when the thickness falls below around 30 $\mu$m. Preferably, the laminate is at least 60 $\mu$m, and more preferably at least 70 $\mu$m, thick. More usually, it is between 75 and 90 $\mu$m thick. Optimum levels of performance appear to be achieved with this particular plastics material when it comprises a 70 $\mu$m film of polyethylene laminated to a 12 $\mu$m film of polyethylene terephthalate, giving an overall thickness in the region of 82 to 85 $\mu$m. At this thickness, the level of light transmittance is found to be approximately 74%. It is believed that the thickness of adhesive layers is typically about 3 $\mu$m.

The liquid photopolymer preparation may comprise any readily available photopolymer preparation of the type which will be will known to the skilled person. Typical liquid photopolymers may include, for example, unsaturated polyester resins, unsaturated polyurethane resins, unsaturated polyamide resins and unsaturated poly(meth)acrylate resins, for example polyether urethane polymers, or polyether polyester urethane copolymers such as polyether polyester urethane methacrylate photopolymers.

The liquid photopolymer will in commercial practice include a photoinitiator in the known way. Particularly suitable photoinitiators are organic carbonyl compounds and these include, for example, unsubstituted or substituted benzophenones such as benzophenone, 4-bromobenzophenone, 4,4'-dichlorobenzophenone, 4-4'-dimethoxybenzophenone, 4-methylbenzophenone, 4-hydroxybenzophenone, 3,5-dihydroxybenzophenone, 4-phenylbenzophenone and deoxybenzophenone; unsubstituted or substituted acetophenones such as acetophenone, 4-methylacetophenone, 3,5-dimethylacetophenone, 4-methoxyacetophenone, 2-chloroacetophenone, 4-chloroacetophenone, 2-chloro-3-nitroacetophenone, 2-chloro-5-nitroacetophenone, 2,6-dimethoxyacetophenone, 4-hydroxyacetophenone, $\alpha$-phenylacetophenone and $\alpha,\alpha$-dichloroacetophenone; unsubstituted or substituted aromatic ketones such as deoxybenzoin, phenyl naphthyl ketone, benzoin methyl ether, benzoin ethyl ether, benzoin n-propyl ether, benzoin isopropyl ether, benzoin n-butyl ether, benzoin isobutyl ether, benzoin t-butyl ether and other alkyl ethers of benzoin, and $\alpha$-diketones such as benzil; and various quinone compounds such as p-benzoquinone, 2,5-dimethyl-p-benzoquinone, 2,6-dichloro-p-benzoquinone, 9,10-anthraquinone, 2-methyl-9,10-anthraquinone, 2-ethyl-9,10-anthraquinone, 2-bromo-9,10-anthraquinone, 2-ethyl-5,6,7,8-tetrahydroanthraquinone, 1,4-naphthoquinone, 2,3-dichloronaphthoquinone, 2,3-dimethyl-1,4-naphthoquinone, 2-ethyl-1,4-naphthoquinone, phenanthraquinone and 1,2-naphthoquinone. Furthermore, the photoinitiator may comprise a mixture of compounds, for example a mixture of one or more of the above named compounds.

Additionally, the resin preparation may contain any one or more of a range of further performance-enhancing additives including, for example, esters of acrylic or methacrylic acid, stabilisers, defoamers, dyes and high molecular weight fatty acids; the fatty acids, for example myristic acid, are particularly effective in ensuring a dry, tack-free surface after post-curing of the washed plate. However, it is found that the presence of myristic acid in the photopolymer package can result in a degree of cloudiness; whilst this is not detrimental to the performance of the package, it is considered to be cosmetically undesirable, and it is contemplated that the presence of this material could be avoided.

According to another aspect of the present invention, there is provided a method for forming a photopolymer package for use in making a hand stamp, the method comprising filling an envelope with a photocurable liquid polymer and sealing the envelope to form a package consisting of a sealed sachet and said polymer, the envelope being made of material which is releasable from the cured photopolymer.

A first embodiment of this aspect of the invention envisages a method for forming a photopolymer package for use in making a hand stamp which comprises: providing an envelope which comprises a pre-formed pouch to contain the photocurable liquid polymer, the pouch being formed from a sheet or sheets, both of which can be released from the cured photopolymer, and having a mouth to receive the liquid curable polymer; introducing the photocurable liquid polymer into the pouch by way of the mouth of the pouch to fill the pouch to a level less than its capacity; applying a vacuum to draw the sides of the pouch together above the level of the photopolymer; and then sealing the adjoining portions of the sheet or sheets together to form a package consisting of a sealed sachet and said polymer.

After filling the pouch with the photopolymer, the mouth of the pouch is sealed by suitable means, preferably by thermosealing.

A second embodiment of this aspect of the invention envisages a method for forming a photopolymer package for use in making a hand stamp, the method being a form-fill-seal process which comprises: forming an envelope to contain the photocurable liquid polymer from a sheet or sheets, both of which can be released from the cured photopolymer, the envelope having a mouth to receive the liquid curable polymer; introducing the photocurable liquid polymer into the envelope by way of the mouth of the envelope to fill the envelope; and then sealing the portions of the sheet or sheets together to form a package consisting of a sealed sachet and said polymer. The invention thereby includes a method in which a photopolymer package for use in making a hand stamp is made by a method consisting essentially of a form-fill-seal technique using a sheet or sheets, neither of which adheres to the cured resin.

A third embodiment of this aspect of the invention envisages a method for forming a photopolymer package for use in making a hand stamp, the method being a form-fill-seal process which comprises: forming an envelope to contain the photocurable liquid polymer from a sheet or sheets, both of which can be released from the cured photopolymer, the envelope having a mouth to receive the liquid curable polymer; introducing the photocurable liquid polymer into the envelope by way of the mouth of the envelope to fill the envelope beyond its capacity; and then sealing the portions of the sheet or sheets together through the excess photopolymer to form a package consisting of a sealed sachet and said polymer.

When overfilling is used, we have found standard polyolefin sheeting workable. However, the mouth portions of the sheet or sheets may be specially selected to facilitate thermosealing together despite the presence between those portions of fats present in commercial prepolymer preparations, as a result of overfilling the envelope. The presence of these fats can have a deleterious effect on the thermosealability of the mouth portions if standard polyolefin sheeting is used. The fats are those present in a typical curable liquid photopolymer such as an unsaturated polyester urethane methacrylate and/or polyether polyester urethane methacrylate prepolymer, ethylenically unsaturated monomers such as esters of acrylic acid and/or methacrylic acid and a photopolymerisation initiator. A suitable adapted transparent plastics sheet material is Rocklid (Trade Mark) or Rockseal-O (Trade Mark) of Rockwell Solutions Limited. Rockseal-O in particular is specially designed to thermoseal through fats and oil.

In our method, despite the presence of the photopolymer on the inside surface of the sheet portions forming the mouth, the sheets or sheets seal together because they have been specially selected to be thermosealable despite the presence of fats.

A fourth embodiment of this aspect of the invention envisages a method for forming a photopolymer package for use in making a hand stamp, the method being a form-fill-seal process which comprises: forming an envelope to contain the photocurable liquid polymer from a sheet or sheets, both of which can be released from the cured photopolymer, the envelope having a mouth formed between adjoining portions of the sheet or sheets to receive the liquid curable polymer; introducing the photocurable liquid polymer into the envelope by way of the mouth of the envelope to fill the envelope to a level less than its capacity; applying a vacuum to draw the sides of the envelope together above the level of the photopolymer; and then sealing the portions of the sheet or sheets together to form a package which consists of a sealed sachet and said polymer.

As in the case of the pre-formed envelope, formation of the envelope as a stage in the form-fill-seal procedure may involve the use of either one or two sheets of plastics material, but envelopes formed from two sheets are preferred. In the case wherein the envelope is produced from a single sheet of material, the sheet is folded in half and the two sides adjacent the fold are sealed, preferably by thermosealing, leaving the side of the envelope opposite the folded side open for filling with photopolymer. When two sheets of plastics film are employed, the sheets should be of equal size; one is placed on top of the other and the assembly is sealed on three sides, again leaving an envelope with one open side, forming a mouth through which filling with photopolymer can take place. Sachets formed from a single sheet of material include three sides which are sealed, the fourth side comprising a fold, whereas the preferred sachets, formed from two sheets of material, are sealed on all four sides.

The liquid photopolymer is introduced into the open mouth of the pouch or envelope for example by pouring or injecting. The photopolymer may be heated to around 50–60° C. to decrease its viscosity and thereby facilitate greater ease of transfer to the pouch or envelope; removal of air and other gases from the photopolymer whilst under vacuum is also made easier by raising the temperature in this way. The sealing operation may then take place, preferably using any of the standard thermosealing techniques well known to those skilled in the art.

A preferred method comprises forming a photopolymer package for use in making a hand stamp wherein a pouch is pre-formed from two sheets of identical plastics film. Production of the sealed sachet forming the photopolymer package from the said pouch may then be achieved by either manual or automated means. Thus, the pre-formed pouch may be manually filled by pouring or injecting the photopolymer, or a pump or gravimetric/peristaltic system may be used, and the pouch can then be sealed by means of a heated bar in a vacuum chamber; commercially available vacuum packing apparatus, such as the Multivac C400, may conveniently be used for the latter purpose. Typically, the pouch is held under vacuum for 1–2 minutes to allow the sealing process to be completed.

Alternatively, an automated procedure may be employed, wherein a succession of pre-formed pouches are mounted in line, individually vacuum filled with photopolymer, then either individually vacuum sealed by application of a local vacuum to each envelope in turn or, more preferably, bulk sealed by introducing a multiplicity of filled envelopes into a vacuum chamber prior to performing the sealing operation. In any event, the photopolymer is allowed to settle in the pouch, causing the sides to bulge slightly after filling, prior to drawing together the adjacent sides at the open end and sealing, preferably by thermal means.

During the vacuum application stage of these procedures, when the adjacent sides of the sachet are drawn together prior to sealing, it has been observed that significant foaming of the photopolymer is prone to occur as the vacuum is applied. For practical reasons, it is not possible to continue the procedure until foaming totally ceases since this would be excessively time-consuming. Consequently, the sachet is generally sealed whilst some amounts of gas bubbles remain therein. These residual amounts, possibly excepting minimal bubbles of no significance, appear to be "absorbed" within the volume of the photopolymer after a period of, say, a day, and seem to have no detrimental effect. This observation again highlights the fact that complete removal of gas from the sachet is not a prerequisite for its satisfactory performance.

As previously discussed, a wide variety of thermoplastic and heat-sealable materials may be used for the formation of sachets by the methods envisaged by the present invention, suitable examples including polyethylenes and various laminates. The nature of the material determines the particular heat-sealing technique which is employed, but these will generally involve the application of heat and pressure. Many thermoplastics are sealed by means of impulse sealing, wherein a charge of electricity heats a wire to a pre-established temperature, and no specific tooling pressure is required.

The resulting sachet has the advantage over materials of the prior art that it comprises continuous, uniform walls on each side, since the invention requires neither a backing sheet nor treatment subsequent to sealing to release air from the envelope and, consequently, no hole is introduced into any part of the sachet. The absence of such defects at this stage has advantages both in terms of storage life and the subsequent performance of the plate in use.

As previously observed, in addition to the use of a pre-formed pouch for the production of the photopolymer package, the invention also envisages the use of a form-fill-seal technique to produce an envelope suitable for such purpose. Two principal form-fill-seal techniques are known, namely horizontal form-fill-seal (HFFS) and vertical form-fill-seal (VFFS). HFFS is used for a variety of products and, as the name suggests, involves the material forming the sachet travelling in a horizontal plane. Typically, the material is dispensed from a roll and is pulled forward and folded to form a tube, whereupon the side opposite the fold is heat sealed. Subsequently, the ends are sealed, the back seal on one pouch forming the front seal on the next, and the resulting sachet is cut free. Filling of the sachet is achieved by cutting it open and inserting the relevant product by top-filling, following which the sachet is resealed.

Clearly, the cutting open and resealing procedure generally associated with HFFS represents a drawback of the technique, and it would be advantageous if the sachet could be filled prior to final sealing. This is possible by means of VFFS, wherein a web of material is driven or pulled down vertically, wrapped round a collar to form a tube and the side opposite the fold is sealed, as with HFFS. Alternatively, the web of material may be cut in two and the two strips in generally vertical orientation are then presented face to face with both sides requiring sealing in order to form the requisite tube. Thereafter, the bottom end of the tube, which will form one end of the sachet, is sealed. Filling of the sachet with the relevant product then takes place, after which the top of the sachet is sealed, this seal simultaneously forming the bottom of the next sachet, with the lower formed and filled sachet being cut free from the upper sachet at this stage. Conveniently, the filler device (fill tube) may be mounted directly above the tube forming section.

It has been found that commercial automatic VFFS sachet packaging machines are suitable for the formation of photopolymer packages in accordance with the foregoing method. In particular, those machines which cut a web of material into two sheets, then bring these sheets face to face and seal them together, have been utilised with success.

Thus, a reel of plastics material is fed through the machine until it reaches a blade which slits the material into two equal sections. The separate sections are split off in opposite directions at 90° to the reel through a film divider unit. The inner sides of the two sections of plastics material are then positioned to vertically face each other and brought together in order that the bottom and sides may be heat sealed to form an open sachet.

The dosage of photopolymer required to be present in a single sachet is then introduced into the sachet by means of an appropriately located fill tube connected to a pump or gravimetric/peristaltic system. The operation is carried out under vacuum in order to eliminate air although, as previously disclosed, it is not essential to the performance of the invention that all air should be removed in every case, which is not true of the methods of the prior art.

Following the initial dosing procedure, the top seal of the sachet is formed by heat sealing, this seal also forming the bottom seal for the next sachet in the continuous web of plastics material. The side seals of the next sachet are formed at the same time, thereby beginning the cycle again, the next sachet being filled in the manner previously described. The individual sachets are then cut off from each other by means of a slitter.

Thus is provided a continuous method for the production of photopolymer packages according to the method of the invention.

The automatic sachet packaging machines of this type may be used to pack into sachets viscous liquid products in volumes from 1 ml to 250 ml. The optimum dose of photopolymer for the purposes of the invention is determined by the size of the photopolymer package which is to be manufactured.

In general, sachets having a length of between 32 mm and 400 mm, and a width in the range from 25 mm to 280 mm may be produced using these automatic sachet packaging machines, and the precise dimensions may be tailored to the proposed end use of the hand stamp, as will be discussed at a later stage. A wide range of plastics materials is suitable for use with such machines, but the preferred thickness is from 20 to 130 g/m$^2$.

However, the use of pre-formed pouches allows for the removal of such constraints with regard to the dimensions of the envelopes and it is possible to envisage the use of a range of envelopes, tailored in size to the exact requirements of the eventual end-user. Thus, the preferred method of manufacture allows for complete flexibility in the selection of package size.

Following filling and sealing, the sachet is irradiated to cure the photopolymer, the walls of the envelope are removed and the remaining material is washed to remove uncured photopolymer and leave the plate which is to form the printing head for a hand stamp. These steps are described more fully below, by way of non-limiting illustration.

Thus, another aspect of the present invention provides a method for the preparation of a plate for use as a hand stamp, the method comprising:

(a) providing a photopolymer package of the invention;

(b) imagewise irradiating the package;

(c) removing the material forming the walls of the package;

(d) washing the resultant cured plate to remove non-irradiated material;

(e) post-exposing the washed out plate to remove surface tackiness; and (f) drying the plate.

Irradiation of the package is carried out by exposure of the sachet containing the photopolymer to curing radiation through a masking element (usually a photographic negative) which selectively blocks areas from irradiation. The top surface, near to which any remaining air will have migrated, is exposed to substantially uniform radiation of an intensity which, during the exposure time, cures only a surface region of the polymer to form a continuous back surface which will play no direct part in printing operations, but does provide a surface by means of which attachment to a device such as a handle may be effected, thereby enhancing ease of use. Meanwhile, the lower surface of the sachet, away from which any remaining air bubbles will have risen, is irradiated while a masking film (e.g. a photographic negative) is interposed between the wall of the sachet and the radiation source, such that the photocurable liquid polymer in the bottom region cures selectively in areas where the masking film allows more transmission of radiation. The radiation used is usually actinic radiation, preferably ultraviolet radiation.

The sachets of the present invention offer a further advantage over the prior art during the exposure stage, in that it is not necessary for air to be evacuated from the space between the masking element and the sachet whilst irradiation is taking place. Previously, it had been found that sharpness of image formation and efficiency of curing was adversely affected by the presence of even small pockets of air in the space between the masking element and the containing wall of the envelope holding the photopolymer; this had always required the evacuation of this space prior to exposure.

As has already been stated, following irradiation of the sachet and its contents, it is necessary to remove the material forming the walls of the sachet in order to reveal the cured resin formed on irradiation of the curable photopolymer. Removal of this material may be achieved with relative ease by simply cutting the material and removing the cured photopolymer.

The front surface of the resulting cured photopolymer plate has liquid photopolymer preparation in unexposed areas. This liquid photopolymer may then be removed by washing the plate; this can be done simply using detergent under a running tap, but is more typically performed using a wash out unit providing a spray or jet of aqueous liquid. The wash out unit normally comprises a rotary drum and clamp devices to hold the plate to the drum, with the back surface against the drum, so that the liquid photopolymer is exposed. The wash out unit also has spray apparatus, normally comprising a multiplicity of spray heads, arranged to spray wash out liquid onto the clamped plate while the drum rotates so as to wash liquid photopolymer out of the plate. The wash out liquid comprises an aqueous medium containing a surfactant and preferably an anti-foaming agent. The wash out liquid should be free of significant quantities of organic solvent in order to avoid damage to the washed plate.

The surfactant is conveniently added to water to form the wash out liquid in an amount of from 3% to 5% by weight based on the amount of water. The process of the invention may use any surfactant in a suitable concentration, typical examples being alkyl sulphates, (e.g. lauryl sulphate), dialkyl sulphosuccinates (e.g. sodium dioctyl sulphosuccinate), triethanolamine alkyl sulphates, polyoxyethylene alkylphenylether sulphonic acid sodium salts and polyoxyethylene alkylbenzene sulphonic acid triethanolamine salts. If desired, the surfactant may comprise a mixture of two or more surfactant compounds. Suitably, the wash out liquid could contain a hydrogen-abstraction compound as described in GB Patent Application No 9928046.3 and U.S. Patent Application No. 60/167685, the content of which is incorporated herein by reference.

The wash out unit may be employed under conventional conditions, for example the wash out liquid may be employed at room temperature (ambient temperature) or at an elevated temperature of, for example, up to 50° C., e.g. about 40° C.

The front surface of the washed plate is tacky in areas previously covered by uncured photopolymer and is typically post-exposed to curing radiation to remove tack. Post-exposure typically involves exposure of the plate to ultraviolet light, generally at a wavelength of from 200–300 nm, and the procedure may be carried out by means of any commercially available post-exposure unit. Post-exposure is traditionally carried out under water, which provides substantially anaerobic conditions, and the water contains dissolved post-exposure salts to prevent the small amount of dissolved oxygen inhibiting curing; the post-exposure salts in practice include sodium sulphite (an oxygen scavenger). As an alternative, however, the post-exposure may be carried out under dry conditions. The post-exposure treatment provides a plate having a smooth, tack free, fine surface finish.

Drying of the post-exposed plate may be achieved by means of any suitable technique, but the preferred method is air drying at an elevated temperature, typically around 60° C., and this is generally carried out in an oven. The drying procedure may, of course, be effected before the post exposure treatment in the event that this treatment is to be carried out under dry conditions.

The resulting photorelief plate is particularly suitable for use in the preparation of hand stamps.

Accordingly, the present invention provides a plate for use as a hand stamp and obtained using a method of the invention.

Another aspect of the present invention resides in a hand stamp for use in the stamping of documents and comprising a plate of the invention.

The hand stamps of the invention may be produced in a variety of sizes according to their proposed use. Most conveniently, however, the stamps are designed to be not greater in size than the most common standard paper sizes, such as A3. Thus, the largest size stamps would typically not exceed the following dimensions:

| A3 | 16½ inches × 11⅔ inches | (42 cm × 29.6 cm) |
| Foolscap | 13 inches × 8 inches | (33 cm × 20.3 cm) |
| US | 11 inches × 8½ inches | (27.9 cm × 21.6 cm) |

As previously observed, the present invention allows the stamps to be tailored to the exact size required by the user by manufacturing the sachets to the desired size. More usually, the sachets will provide a plate whose dimensions are smaller than these standard sizes, for example approximately a half (A4), a quarter (A5) or an eighth (A6) of the standard A3 size.

As discussed previously, the present inventor has found that the performance of plates produced according to one embodiment of the present invention is not deleteriously affected by the presence of small amounts of trapped air or gas in the sachet containing the photocurable liquid polymer prior to curing. Consequently, it is envisaged that photopolymer packages of this embodiment of the present invention may contain such bubbles to a limited extent. However, it is not, of course, necessary that these bubbles should be present, and it is quite possible that a number of the packages coming off a production line will, in fact, be free from such bubbles. In the mass manufacture of sachets by form-fill-seal in which the sachets are to be filled with the precise amount of liquid for complete filling, manufacturing tolerances will inevitably result in a proportion of sachets containing bubbles when they are produced according to the relevant embodiment of the present invention.

Consequently, the present invention includes a multiplicity of photopolymer packages for use in making hand stamp plates, the packages consisting of form-fill-seal sachets containing a curable liquid photopolymer, the walls of the sachets being formed of a material capable of being released from the cured photopolymer, a proportion of the packages containing bubbles.

Conveniently, such a multiplicity of packages may be stored or transported by means of boxes or other suitable containers which may, typically, be loaded on one or more pallets for ease of handling.

Various aspects of the invention will now be particularly described with reference to the following examples:

EXAMPLES

Example 1

A pouch having the dimensions 12 inches×8⅗ inches (30.5 cm×21.8 cm), and sealed on three sides, was preformed from a laminate of polyethylene film of 70 μm thickness and polyethylene terephthalate film of 12 μm thickness, having an adhesive interlayer.

A photopolymer composition (217 g) comprising a polyether urethane liquid prepolymer (VERBATIM® photopolymer from Chemence Limited, Corby, NN17 4XD, United Kingdom, or from Chemence Inc of Alpharetta, Ga. 30201, USA) was then introduced into the pouch through a fill tube, the pouch was placed in a Multivac C400 vacuum packing apparatus such that it was laid at an angle against the seal bar, with the open end against the seal bar. A vacuum was then applied to draw the sides of the sachet together at the open end and remove most of the entrapped air, and the seal bar was applied in order to heat seal the top of the sachet. The resulting photopolymer package, which had a thickness of ⅛ inch (0.32 cm), produced an image area of 11⁷⁄₁₀ inches×8³⁄₁₀ inches (30.5 cm×21.8 cm) and was ready for use in a platemaking operation.

Example 2

The procedure of Example 1 was repeated using a photopolymer composition comprising VERBATIM® polyether urethane liquid prepolymer (217 g), diluted with polypropyleneglycol monomethacrylate (151 g), and further comprising triethyleneglycol dimethacrylate (40 g), hydroxypropyl methacrylate (0.5 g), Irgacure 651 (0.5 g) (available from Ciba-Geigy) and myristic acid (0.3 g). The resulting resin composition had a viscosity of 8500 cp and provided a photopolymer package which was ready for use in a platemaking operation.

Example 3

A reel of laminated polyethylene/polyethylene terephthalate of the type disclosed in Example 1, and having a width of 7⅕ inches (18.2 cm), was fed into an automatic sachet packaging machine. The machine included a blade disposed to slit the laminate into two equal sections and was designed to propel the sections so formed in opposite directions at 90° to the reel through a film divider unit.

The inner sides of the two sections of the laminate were then positioned vertically to face each other and brought together. The bottom and side sections of the assembly were then heat sealed by means of horizontal and vertical heat sealing dies respectively, to form an open sachet.

A photopolymer composition (21.4 g) as disclosed in Example 1 was then pumped into the sachet through a fill tube under vacuum, the assembly was advanced through the machine, and the horizontal and vertical crimp heat sealing dies were reapplied in order to heat seal the top of the sachet—at the same time forming the bottom seal of the next sachet—and seal the sides of the next sachet, which was then ready for filling in the same manner as above. Sachets having dimensions of 4⁵⁄₁₆ inches×3⅗ inches (11.0 cm×9.1 cm) are produced in this way. The sachets have a thickness of ¹⁄₁₀ inch (0.23 cm) and provide an image area of 4 inches×3¼ inches (10.2 cm×8.3 cm).

The individual sachets in the continuous web produced by continuing the process hereinbefore described through a number of iterations are separated by cutting means, and the sachets are then ready for use in the production of a hand stamp printing plate.

As previously discussed, the present invention shows significant advantages over the prior art in that there is no requirement for the use of a plastic backing sheet to provide support for the solidified resin forming the hand stamp base. In the present embodiment, these advantages are enhanced by the fact that there is no need to take any of the precautions or steps necessary to expel air from the sachet after it has been formed. Air is not trapped, and does not collect, in the sachet in an amount sufficient to provide problems in the future preparation of a printing plate and the method thereby offers advantages in terms of cost and time.

In the other embodiments of the method of the invention, whereby the sachet is overfilled—or a vacuum is applied—to expel air from the sachet, the techniques involved are much simpler than those of the prior art as a consequence of the elimination of the requirement for the use of a backing sheet. The hand stamp base may conveniently be affixed to a suitable handle in order to provide a hand stamp which is ready for use. The hand stamps are found to perform to a high standard when employed in practice, typically in an office environment.

Example 4

Various plastics materials were evaluated for performance when used to form a sachet. In each case, the plastics material was formed into a pouch, and the sealed photopolymer package was produced as detailed in Example 1, using the photopolymer preparation described therein. The sealed package had a thickness of 3.2 mm, and was given a main exposure to curing radiation for 60 seconds, and a back exposure for 55 seconds. The appearance of the resulting plate was examined and the results are detailed in Table 1.

The results of these tests show clearly the effects of increasing film thickness, with an evident deterioration in image quality when the thickness exceeds 90 $\mu$m.

TABLE 1

| Type of flexible film | UV light transmission | Plate image |
|---|---|---|
| OPA 12 $\mu$m: PE 30 $\mu$m | Av. 92.1% | Very good image; difficult to handle (stretches easily) |
| OPA 12 $\mu$m: PE 40 $\mu$m | Av. 90.9% | Very good image |
| OPA 12 $\mu$m: PE 50 $\mu$m | Av. 90.0% | Very good image |
| OPA 12 $\mu$m: PE 60 $\mu$m | Av. 89.8% | Very good image |
| OPA 20 $\mu$m: PP 70 $\mu$m | Av. 90.9% | Relatively good; sharp letters but some areas with bad image |
| PETP 12 $\mu$m: PE 30 $\mu$m | Av. 90.3% | Very good image |
| PETP 12 $\mu$m: PE 50 $\mu$m | Av. 87.8% | Very good image |
| PETP 12 $\mu$m: PE 60 $\mu$m | Av. 85.0% | Very good image |
| PETP 12 $\mu$m: PE 80 $\mu$m | Av. 86.1% | Bad image; filled-in reverses and flat letters |
| PETP 12 $\mu$m: PE 100 $\mu$m | Av. 83.7% | Very bad image; filled-in reverses and flat letters |
| PETP 12 $\mu$m: PETP 12 $\mu$m: PP 70 $\mu$m | Av. 85.4% | Bad image |
| M-PETP-Y 12 $\mu$m: PE 70 $\mu$m | Av. 68.1% | Very good image |

Key:
OPA = Orientated Polyamide
PE = Polyethylene
PP = Polypropylene
PETP = Polyethylene Terephthalate
M-PETP-Y = Modified Polyethylene Terephthalate

What is claimed is:

1. A photopolymer package for use in making a hand stamp plate, the package being shaped for making a hand stamp plate having dimensions not exceeding about 16½ inches by about 11⅔ inches and consisting essentially of a sealed sachet and a curable liquid photopolymer preparation contained in the sachet, the walls of the sachet being formed of material which is releasable from the cured photopolymer and the photopolymer preparation comprising a resin selected from the group consisting of unsaturated polyurethanes, polyether urethanes, polyether polyester urethane copolymers and polyether polyester urethane methacrylates.

2. The package as claimed in claim 1 in which the walls of the sachet are made of the same material.

3. The package as claimed in claim 2 wherein the material is selected from the group consisting of polyolefins and laminates of polyethylene with a polyethylene terephthalate product.

4. The package as claimed in claim 2 wherein:
the material is selected from the group consisting of polyolefins and polyolefin laminates;
the thickness of the sachet walls is from about 50 $\mu$m to about 100 $\mu$m; and
the sachet is rectangular and
(i) has four sides which comprise seals between opposed sheets of said material, or
(ii) is formed from a single sheet of material and has three sides which comprise seals between opposed portions of said sheet and a fourth side which comprises a fold in said sheet.

5. The package as claimed in claim 2 wherein the material is untreated.

6. The package as claimed in claim 1 wherein the material comprises one or more polyolefins.

7. The package as claimed in claim 1 wherein the material is selected from the group consisting of polyolefins, oriented polyamide, polyethylene terephthalate, modified polyethylene terephthalate and laminates thereof.

8. The package as claimed in claim 7 wherein the thickness of the walls of the sachet is in the range from about 60 $\mu$m to about 90 $\mu$m.

9. The package as claimed in claim 8 wherein the walls of the sachet are made of the same material.

10. The package as claimed in claim 1 wherein the thickness of the walls of the sachet is in the range from about 50 $\mu$m to about 100 $\mu$m.

11. The package as claimed in claim 7 wherein the thickness of the walls of the sachet is in the range from about 50 $\mu$m to less than about 95 $\mu$m.

12. The package as claimed in claim 1 wherein the walls of the sachet are made of a film whose average transmission of curing UV radiation is at least 85%.

13. The package as claimed in claim 12 wherein the film has a thickness of from about 50 $\mu$m to less than about 95 $\mu$m.

14. The package as claimed in claim 13, which produces a cured plate whose image quality is at least as good as that produced by a 20 $\mu$m oriented polyamide: 70 $\mu$m polypropylene laminate.

15. The package as claimed in claim 1 wherein the sachet is rectangular and has four sides, all of which sides comprise seals between opposed sheets of said material.

16. The package as claimed in claim 1 wherein the sachet is rectangular and is formed of a single sheet of said material, the sachet having four sides, three of said sides comprising seals between opposed portions of said sheet and one of said sides comprising a fold between said portions.

17. The package of claim 1 wherein the resin comprises a polymer selected from the group consisting of polyether urethanes, polyether polyester urethane copolymers and polyether polyester urethane methacrylates.

18. The package of claim 1 wherein the resin comprises a polyether polyester urethane methacrylate, the thickness of the walls of the sachet is in the range from about 60 $\mu$m to about 90 $\mu$m and the walls are made of a material selected from the group consisting of polyolefins and polyolefin laminates.

19. The package of claim 1 wherein
the resin comprises a polymer selected from the group consisting of polyether urethanes, polyether polyester urethane copolymers and polyether polyester urethane methacrylates;
the sachet walls have a thickness of from about 50 $\mu$m to about 100 $\mu$m; and
the sachet walls are made from a material selected from the group consisting of polyolefins and polyolefin laminates.

20. The package of claim 19 wherein the sachet walls have a thickness of from about 50 $\mu$m to less than about 95 $\mu$m and the package has a thickness of about ⅛ inch.

21. A photopolymer package adapted for use in making a hand stamp plate, the package consisting essentially of a sealed sachet and, contained in the sachet, a curable liquid photopolymer adapted to be photocurable to form a hand stamp plate, the walls of the sachet being formed of the same material, the material being releasable from the cured photopolymer and having a thickness of about 50 $\mu$m or more.

22. The photopolymer package as claimed in claim 21 wherein the sachet comprises a pre-formed pouch.

23. The photopolymer package as claimed in claim 21 wherein the sachet comprises a form-fill-seal envelope.

24. The package as claimed in claim 21 wherein the photopolymer preparation includes a photoinitiator and the package has a predetermined shape.

25. The package as claimed in claim 24 wherein the material is selected from the group consisting of polyolefins and polyolefin laminates.

26. The package as claimed in claim 25 wherein the thickness of the walls of the sachet is in the range from about 70 µm to 90 µm.

27. The package as claimed in claim 25 which is shaped for making a hand stamp plate having dimensions not exceeding about 16½ inches by about 11⅔ inches and wherein the thickness of the walls is not more than about 100 µm and the photopolymer resin comprises a polymer selected from the group consisting of polyether urethanes, polyether polyester urethane copolymers and polyether polyester urethane methacrylates.

28. The package as claimed in claim 21 wherein the thickness of the walls of the sachet is in the range form about 50 µm to 100 µm.

29. The package as claimed in claim 21 which is shaped for making a hand stamp plate having dimensions not exceeding about 16½ inches by about 11⅔ inches.

30. The package as claimed in claim 21 which is shaped for making a hand stamp plate having dimensions not exceeding about 13 inches by about 8 inches.

31. The package as claimed in claim 21 wherein the photopolymer resin comprises a polymer selected from the group consisting of polyether urethanes, polyether polyester urethane copolymers and polyether polyester urethane methacrylates.

32. A hand stamp plate photopolymer package consisting essentially of a sealed sachet in the form of a pre-formed pouch and, contained in the sachet, a curable liquid photopolymer preparation adapted for making a hand stamp plate, the pouch being formed of a material which comprises a polyethylene layer between about 50 µm and about 90 µm thick, the material being releasable from the cured photopolymer.

33. A hand stamp plate photopolymer package consisting essentially of a sealed sachet and a curable liquid photopolymer preparation contained in the sachet, the photopolymer preparation being adapted for making a hand stamp plate and including a photoinitiator, the walls of the sachet all being formed of the same material, said material being releasable from the cured photopolymer and comprising a polyolefin material selected from the group consisting of polyolefin films and laminated plastics films which comprise a polyolefin and the thickness of the walls of the sachet being in the range from about 50 µm to 100 µm.

34. The photopolymer package as claimed in claim 33 wherein the sachet comprises a pre-formed pouch.

35. A photopolymer package comprising a sealed sachet and a curable liquid photopolymer preparation contained in the sachet, wherein:
the package is adapted for use in making a hand stamp plate by imagewise irradiation of the package to cure photopolymer preparation in the sachet;
the package is shaped for the photopolymer to cure to form a plate of about predetermined size;
the package consists essentially of only the sachet and the photopolymer preparation;
the walls of the sachet are releasable from the cured photopolymer, have a high degree of crease-resistance, are able to transmit UV radiation without seriously diffracting it, have a thickness from about 50 µm to about 100 µm and are made of the same material;
the photopolymer preparation comprises a photopolymer selected from the group consisting of polyether urethanes, polyether polyester urethane copolymers and polyether polyester urethane methacrylates; and
the package is shaped for making a hand stamp plate having dimensions not exceeding about 16½ inches by about 11⅔ inches.

36. The package of claim 35 wherein the walls of the sachet are made of a film whose average UV radiation transmission is at least 85% and which produces a cured plate whose image quality is at least as good as that produced by a 20 µm oriented polyamide: 70 µm polypropylene laminate.

37. The photopolymer package as claimed in claim 35 which has a thickness of about 1/10 inch.

38. A method of making a photopolymer package for use in making a hand stamp, the method comprising filling an envelope with a photocurable liquid polymer and sealing the envelope to form a package consisting essentially of a sealed sachet and the said polymer, the envelope being shaped for the photopolymer, when cured, to make a hand stamp plate and being made of material which is releasable from the cured photopolymer, and the liquid polymer being capable of curing to form a hand stamp plate when the package is exposed imagewise to curing radiation;
wherein the envelope is made of a film selected from the group consisting of polyolefin films and polyolefin laminate films, said film being from 50 µm to 100 µm thick; and
the liquid photopolymer comprises a photopolymer selected from the group consisting of polyether urethanes, polyether polyester urethane copolymers and polyether polyester urethane methacrylates.

39. The method as claimed in claim 38 wherein the photopolymer is a polyether urethane resin or a polyether polyester urethane methacrylate.

40. The method as claimed in claim 38 wherein the envelope is sealed in a vacuum packing machine.

41. The method of claim 38 which is a form-fill-seal process which comprises:
forming said envelope from a sheet or sheets, both of which can be released from the cured photopolymer, the envelope having a mouth to receive the liquid curable polymer;
introducing the photocurable liquid polymer into the envelope by way of the mouth of the envelope to fill the envelope; and then sealing the portions of the sheet or sheets together to form said package.

42. The method as claimed in claim 38 wherein the envelope is formed from two sheets.

43. The method as claimed in claim 38 wherein the envelope is formed from a single sheet.

44. A method of making a photopolymer package for use in making a hand stamp, the method comprising: providing an envelope which comprises a pre-formed pouch to contain a photocurable liquid polymer, the pouch being formed from a sheet or sheets, both of which can be released from the cured photopolymer, and having a mouth to receive the liquid curable polymer; introducing into the pouch by way of the mouth of the pouch a liquid photopolymer capable of curing to form a hand stamp plate when the completed package is exposed imagewise to curing radiation, to fill the envelope to a level less than its capacity; applying a vacuum to draw the sides of the pouch together above the level of the photopolymer; and then sealing the adjoining portions of the sheet or sheets together to form a package consisting essentially of the said sealed pouch and said polymer and shaped to make a hand stamp plate;

wherein the envelope is made of a film selected from the group consisting of polyolefin films and polyolefin laminate films, said film being from 50 µm to 100 µm thick; and the liquid photopolymer comprises a photopolymer selected from the group consisting of polyether urethanes, polyether polyester urethane copolymers and polyether polyester urethane methacrylates.

45. The method as claimed in claim 44 wherein the photopolymer is a polyether urethane or a polyether polyester urethane methacrylate.

46. The method as claimed in claim 44 wherein the envelope is sealed in a vacuum packing machine.

47. The method as claimed in claim 44 wherein the envelope is formed from two sheets.

48. The method as claimed in claim 44 which comprises a vertical fill-form-seal technique.

49. A method of making a photopolymer package for use in making a hand stamp plate, the method being a form-fill-seal process which comprises forming an envelope to contain a photocurable liquid polymer from a sheet or sheets, both of which can be released from the cured photopolymer, the envelope having a mouth to receive the liquid curable polymer; introducing into the envelope by way of the mouth of the envelope a photocurable liquid polymer comprising a polymer selected from the group consisting of polyether urethanes, polyether polyester urethane copolymers and polyether polyester urethane methacrylates, to fill the envelope beyond its capacity; and then sealing the portions of the sheet or sheets together through the excess photopolymer to form a package consisting essentially of a sealed sachet and said polymer and shaped for making a hand stamp plate having dimensions not exceeding about 16½ inches by about 11⅔ inches.

50. The method as claimed in claim 49 which comprises a vertical fill-form-seal technique.

51. A method for forming a photopolymer package for use in making a hand stamp plate, the method being a form-fill-seal process which comprises: forming an envelope to contain a photocurable liquid polymer from a sheet or sheets, both of which can be released from the cured photopolymer, the envelope having a mouth to receive the liquid curable polymer; introducing into the envelope by way of the mouth of the envelope a photocurable liquid polymer comprising a polymer selected from the group consisting of polyether urethanes, polyether polyester urethane copolymers and polyether polyester urethane methacrylates, to fill the envelope to a level less than its capacity; applying a vacuum to draw the sides of the envelope together above the level of the photopolymer; and sealing the portions of the sheet or sheets together to form a package consisting essentially of a sealed sachet and said polymer and shaped for making a hand stamp plate having dimensions not exceeding about 16½ inches by about 11⅔ inches.

52. The method as claimed in claim 51 which comprises a vertical fill-form-seal technique.

53. A method for the preparation of a plate for use as a hand stamp, the method comprising:

(a) providing a photopolymer package consisting of a sealed sachet and, contained in the sachet, a curable liquid photopolymer preparation which when exposed to curing radiation cures to form a cured photopolymer having the characteristics of a hand stamp plate material, the walls of the sachet being formed of material which is releasable from the cured photopolymer;

(b) imagewise irradiating the package such that the photopolymer cures to form a hand stamp plate consisting essentially of the cured photopolymer;

(c) removing the material forming the walls of the package;

(d) washing the resultant cured plate to remove non-irradiated material;

(e) post-exposing the washed out plate to remove surface tackiness; and (f) drying the plate.

54. The method as claimed in claim 53 wherein the resultant hand stamp plate has dimensions not exceeding about 16½ inches by about 11⅔ inches and the photopolymer preparation comprises an unsaturated polyurethane resin or a polyether polyurethane resin.

55. The method as claimed in claim 54 wherein the sachet is made of a film selected from the group consisting of polyolefin films and polyolefin laminate films, said film being from about 50 µm to about 92 µm thick.

\* \* \* \* \*